United States Patent [19]

Bednorz et al.

[11] Patent Number: 5,602,080
[45] Date of Patent: Feb. 11, 1997

[54] METHOD FOR MANUFACTURING LATTICE-MATCHED SUBSTRATES FOR HIGH-$T_c$ SUPERCONDUCTOR FILMS

[75] Inventors: Johannes G. Bednorz, Wolfhausen; Jochen D. Mannhart, Thalwil; Carl A. Mueller, Hedingen, all of Switzerland; Darrell G. Schlom, State College, Pa.

[73] Assignee: International Business Machines Corporation, Armonk, N.Y.

[21] Appl. No.: 193,919

[22] Filed: Feb. 9, 1994

Related U.S. Application Data

[63] Continuation of Ser. No. 945,759, Sep. 16, 1992, abandoned.

[30] Foreign Application Priority Data

Sep. 16, 1991 [EP] European Pat. Off. .............. 91810732

[51] Int. Cl.⁶ .................................. C30B 15/20
[52] U.S. Cl. ........................ 505/451; 505/729; 505/450; 117/90
[58] Field of Search ................. 505/1, 729, 450, 505/451; 117/90, 94, 106

[56] References Cited

U.S. PATENT DOCUMENTS

| | | | |
|---|---|---|---|
| 5,055,445 | 10/1991 | Belt et al. ............................ | 156/621 |
| 5,070,241 | 12/1991 | Jack ...................................... | 505/866 |
| 5,082,688 | 1/1992 | Agostinelli et al. ................. | 505/732 |
| 5,097,128 | 3/1992 | Jack ...................................... | 505/866 |

FOREIGN PATENT DOCUMENTS 63-20896  10/1988  Japan ........................ 505/1

*Primary Examiner*—Robert Kunemund
*Attorney, Agent, or Firm*—Daniel P. Morris

[57] ABSTRACT

This method for manufacturing lattice-matched substrates for high-$T_c$ superconductors employs at least two materials chosen from the group of known suitable substrate materials, of which one has a lattice constant smaller than the lattice constant(s) of the perovskite subcell of the selected superconductor material, while the other one has a lattice constant greater than the lattice constant of the perovskite subcell of the selected superconductor. These materials are then powdered and mixed intimately for providing a single-crystal either from the molten mixture of the chosen materials or by thin film deposition, said single-crystal containing appropriate molar percentages of the chosen materials so that resulting lattice constant is essentially the same as that of the selected superconductor material.

6 Claims, 1 Drawing Sheet

METHOD FOR MANUFACTURING LATTICE-MATCHED SUBSTRATES FOR HIGH-$T_c$ SUPERCONDUCTOR FILMS

This application is a continuation of Ser. No. 07/945,759, filed on Sep. 16, 1992 now abandoned.

FIELD OF THE INVENTION

The subject invention relates to a method for manufacturing substrates suitable for the growth of high-$T_c$ superconductors, in particular for the growth of thin films of high-$T_c$ superconductor materials, by molecular beam epitaxy, for example.

BACKGROUND ART

For many applications of high-$T_c$ superconductors, such as field-effect devices, high-quality thin films of high-$T_c$ superconductor materials are required. The quality of these superconductor films depends to a large extent on the substrate onto which the superconductor material is deposited. In particular, the quality of the high-$T_c$ superconductor films depends on the degree of match between the lattice parameters of the substrate material and the lattice parameters of the superconductor film material. For film thicknesses below about 100 nm, the importance of this match increases with decreasing thickness of the superconductor films.

For the purposes of the description to follow, the term substrate shall be deemed to encompass the bulk material, relatively thick for reasons of mechanical stability, onto which the superconductor is to be deposited, and also the combination of such bulk material and a so-called buffer layer overlaying the bulk material, if any. In short, in the following, substrate refers to that which supports the superconductor film.

The conventional substrate for high-$T_c$ superconductor thin films consists of a single crystal selected from those materials that normally have a relatively small lattice mismatch with respect to the superconductor material. Traditional materials of this sort are strontium titanate $SrTiO_3$, magnesium oxide MgO, yttrium-stabilized cubic zirconium oxide $ZrO_2$, and lanthanum aluminate $LaAlO_3$, for example. These compounds have a lattice mismatch in the $10^{-1}$ to $10^{-3}$ range. For example, the a-axis (b-axis) lattice parameter of the most widely used compound, $YBa_2Cu_3O_{7-\delta}$, is 0.382 nm (0.389 nm), whereas the lattice parameters of $SrTiO_3$, MgO, $ZrO_2$ and $LaAlO_3$ substrates are 0.3905 nm, 0.4213 nm, 0.3607 nm, and 0.3793 nm, respectively, at room temperature.

It is known that differences in physical properties between a substrate and a superconductor film borne by the substrate, such as differences in the thermal expansion coefficients, ordinarily give rise to mechanical stress and strain. Reference is made to an article by H. Hidaka et al. entitled "The Stress-Strain Relationship for Multilayers of the High $T_c$ Superconducting Oxides" published in *Advances in Superconductivity, Proc. of the* 1st International Symposium on Superconductivity (ISS 88), Nagoya 1988, (Springer-Verlag 1989), pp. 581–586. This article points to the importance of a stressless substrate/superconductor relationship, in particular in connection with thin superconductor films.

Similar to differences in physical properties, differences in lattice parameters between a substrate and a superconductor generally lead to stress and/or grain boundary problems in the superconductor film. Several proposals to overcome these problems have already been made. One approach is disclosed in PCT-A-WO 90/04857, where a great many materials that are chemically compatible with the superconductor material have been investigated for closeness of their lattice parameters. Of all materials considered, none was reported to have a lattice constant that perfectly matched the lattice constant of the superconductor material in question.

European patent Appln. No.91 810 336.7 also disclosed the use of nearly-matched materials. Specifically, the application disclosed the use of metallic compounds that had a lattice constant roughly equal to the lattice constant one of the superconductor material to be used. In superconductor/normal-conductor/superconductor ("SNS") heterostructures, such as, e.g. Josephson junctions and field-effect transistors, it was proposed to use, for the metallic substrate, for the insulating layer, if any, and for the high-$T_c$ superconductor layer, materials having at least approximately matching crystal structures and lattice constants. Specifically, the application disclosed that the electrically conductive substrate consist of a metallic oxide such as strontium ruthenate $Sr_2RuO_4$, whereas the superconductor layer was disclosed to be of the copper oxide type and may be $YBa_2Cu_3O_{7-\delta}$, for example. According to the European application, the insulator layer may consist of $SrTiO_3$.

While the intended approximation of the lattice parameters achieved with the materials suggested by the prior art has led to increased quality of the superconductor thin films, there has heretofore remained a certain degree of mismatch which has impeded the manufacture of more perfect thin films.

It is an object of the present invention to provide a simple method for the manufacturing of substrates that closely approach essentially ideal compatibility with the superconductor materials used as concerns their lattice parameters.

SUMMARY OF THE INVENTION

In accordance with the invention, a close match—preferably approaching an ideal match—of the lattice parameters of a substrate—without a buffer layer—to a selected high-$T_c$ superconductor material having a perovskite or a perovskite-like crystal structure can be achieved by a method comprising the following steps: Determining the relevant lattice constant or constants of the selected superconductor material; choosing a desired orientation of the superconductor layer to be deposited on the substrate (e.g. $YBa_2Cu_3O_{7-67}$ (001), $YBa_2Cu_3O_{7-\delta}$(103), . . . ); choosing an equivalent interfacial plane for a perovskite substrate corresponding to a perovskite subcell of the superconductor (e.g. (e.g., $ABO_3$ (100), $ABO_3$ (110), . . . ); choosing at least two materials from the group of known substrate materials, of which one has a lattice constant smaller than the relevant lattice constant or constants of the selected superconductor material for the orientation selected, while the other one has a lattice constant greater than the relevant lattice constant or constants of the selected superconductor for the orientation selected; determining the respective molar percentages of the chosen materials so as to arrive at a desired lattice match for the chosen orientation of the selected superconductor material, and calculating the appropriate weight percentages; extensively milling the chosen materials and mixing the powders intimately,; melting the resulting mixture and drawing a single-crystal from the molten mixture; cutting the crystal so formed to the desired size and crystallographic orientation; and providing a clean surface of the crystal for the deposition of the superconductor.

One preferred method of the invention for manufacturing a lattice-matched substrate for a film of a selected high-$T_c$ superconductor material having a perovskite or perovskite-like crystal structure at a selected orientation relative to the film dimensions comprises the steps set forth below.

The preferred method of the invention includes the step of determining a relevant lattice constant or constants of the selected superconductor material relative to the selected orientation.

The preferred method also includes the step of choosing an equivalent interfacial plane for a substrate having an effectively perovskite structure corresponding to a perovskite subcell of the superconductor relative to the selected orientation.

The preferred method of the invention also includes the step of choosing a first substrate component material and a second substrate component material from the group of known substrate materials for the superconductor. The first substrate component material is selected to have a lattice constant defined in relation to the equivalent interfacial plane which is smaller than the relevant lattice constant or constants of the selected superconductor material for the orientation selected. The second substrate component material is selected to have a lattice constant defined in relation to the equivalent interfacial plane which is greater than the relevant lattice constant or constants of the selected superconductor material for the orientation selected.

The preferred method also includes the step of determining lattice-matching relative proportions of the first and the second substrate component materials effective to provide a desired lattice match at the chosen orientation of the selected superconductor material in relation to the equivalent interfacial plane.

The preferred method of the invention further includes the step of intimately combining the first and the second substrate component materials substantially in the lattice-matching relative proportions to form a composite substrate material having an effective lattice structure which defines a lattice-matching plane corresponding to the equivalent interfacial plane having relevant effective lattice constants which effectively match the relevant lattice constant or constants of the selected superconductor material for the orientation selected for the deposition of the superconductor film.

The preferred method of the invention may include the step of forming a lattice-matched substrate surface on a surface of the composite substrate material oriented essentially parallel to a lattice-matching plane of the effective lattice structure of the material on which a layer of the superconductor material can be deposited in the desired orientation in an effectively lattice-matched interfacial relationship with the composite substrate material.

Preferably, the step of intimately combining the first and the second substrate component materials in the preferred method involves milling the materials to a fine powder, mixing the powders intimately, melting the powders so mixed, and drawing a single crystal of the composite substrate material from the molten mixture.

Alternatively, the step of intimately combining the first and the second substrate component materials in the preferred method may entail codepositing the first and second substrate component materials onto a body of a bulk material to form a buffer layer on the body of bulk material. In certain preferred embodiments, the codeposition may be made form a single source containing a pre-sintered mixture of the first and the second substrate component materials. Alternatively, it may be preferable in certain applications to make the codeposition from separate sources each containing one or more of the materials combined to form the buffer layer.

Preferred substrate component materials include strontium titanate $SrTiO_3$ and lanthanum aluminate $LaAlO_3$ for perovskite-like superconductor materials such as $YBa_2Cu_3O_{7-\delta}$.

In the following description, a preferred method for manufacturing crystalline substrate material having essentially the same lattice constant as the corresponding lattice constant of a selected superconductor material will be disclosed.

BEST AND PREFERRED MODES FOR CARRYING OUT THE INVENTION

Figure 1:
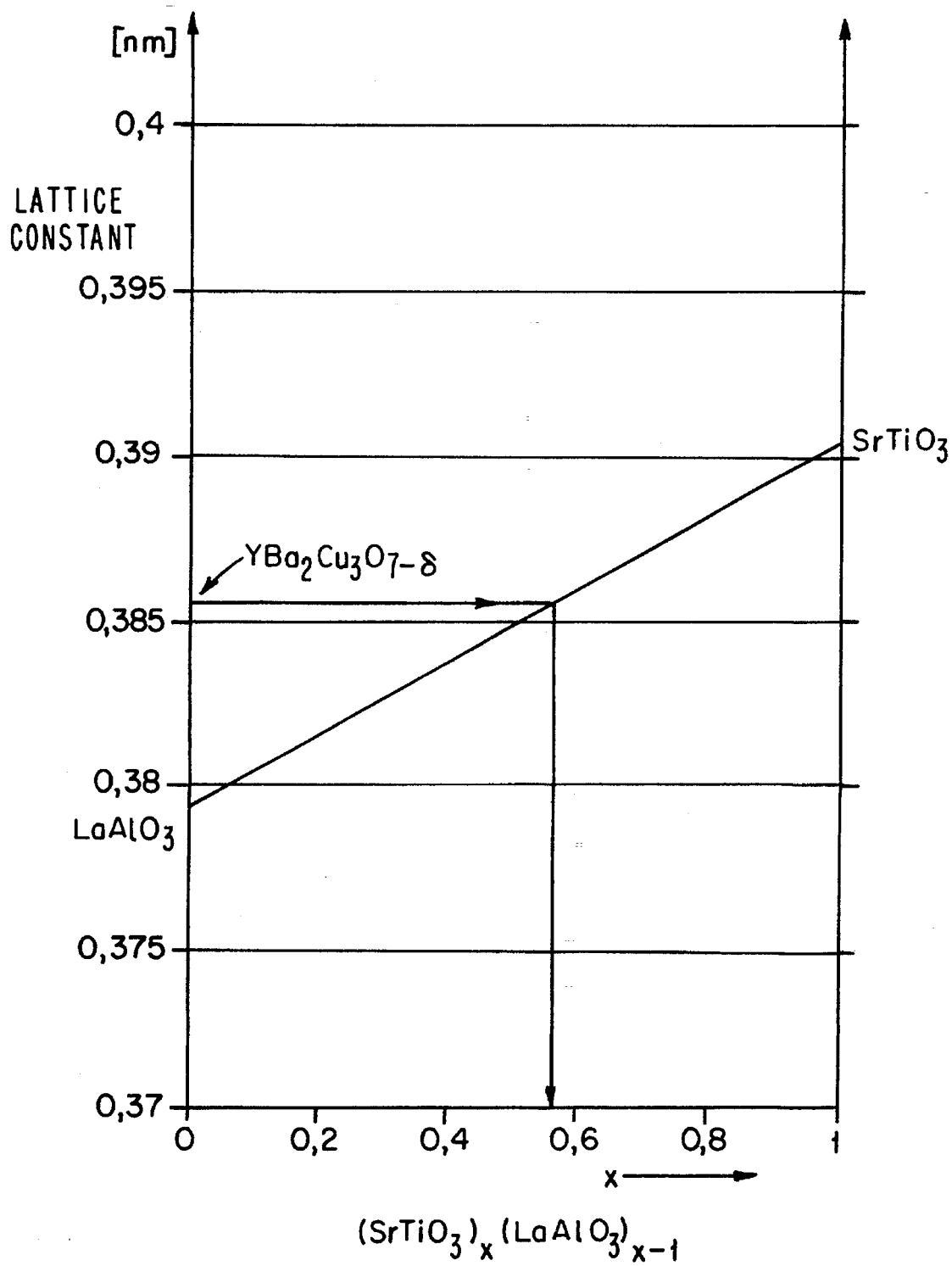
FIG. 1 is a diagram useful in the determination of the required concentration of the constituents in an exemplary pseudo-binary system.

Assume that it is desired to grow a thin film of $YBa_2Cu_3O_{7-\delta}$ oriented with the (001) plane normal to the substrate surface, for example. As mentioned above, the relevant lattice constants are 0.382 nm for the a-axis, and 0.389 nm for the b-axis. To prepare a lattice-matched substrate material, one would select from those materials having a record of suitability for substrate purposes, choosing at least one compound having a lattice constant below that of the superconductor material, and one whose lattice constant is above that of the superconductor material. For the example where a thin film of $YBa_2Cu_3O_{7-\delta}$ is to be deposited, one could choose strontium titanate $SrTiO_3$ (which has a lattice constant of 0.3905 nm), and lanthanum aluminate $LaAlO_3$ (whose lattice constant is 0.3793 nm), for example.

Appropriate variation of the ratio between the strontium titanate $SrTiO_3$ and lanthanum aluminate $LaAlO_3$ materials prior to crystal growth will permit adjusting the lattice constant to any value between 0.3793 and 0.3905 nm.

The preferred process for preparing a substrate—without a buffer layer—starts with the milling of the individual compounds. The powders are then weighed to the correct molar ratio and subsequently mixed intimately. Crystal growth may then occur from the powder mixture by the by a conventional zone melting process, for example. The grown single-crystal may then be cut or cleaved to the desired substrate size and crystallographic orientation. If necessary, the surface of the substrate may finally be cleaned or polished, as required.

Where the substrate is to comprise a bulk body and a buffer layer, one would first prepare the bulk body using conventional material, such as $SrTiO_3$, and cover the body with a thick, epitaxial buffer layer of pseudo-binary (or pseudo-ternary) material grown, for example, by thin film deposition from a single deposition source containing a pre-sintered mixture of the pseudo-binary (or pseudo-ternary) system of components, or from two (or three) separate deposition sources, each containing a single one of the components. The latter procedure would permit the alternate deposition of monolayers of the components. Any thin film deposition method could be used to deposit the buffer layer, such as sputtering, laser ablation, molecular beam epitaxy, chemical vapor deposition, etc.

It should be pointed out that it is important, in the case of a buffer layer, that the buffer layer be made thick enough that the lattice constant at the surface of the buffer layer have the desired value for subsequent growth of one or more superconductor layers.

As a result of this process, the substrate material will generally consist of a matrix of the compound present with the greater percentage, with the other compound or compounds embedded in that matrix in accordance with the prevailing proportion. The embedding occurs as an exchange, in the resulting substrate/buffer layer material, of lattice positions among the participating metal atoms, such that, as an example, within a strontium-titanate/lanthanum-aluminate lattice certain random strontium positions are occupied by lanthanum, certain random titanium positions are occupied by aluminium, and vice-versa, for example. This exchange is known as a solid solution.

The diagram in FIG. 1 shows one way to determine an appropriate molar composition for any desired lattice constant with the range defined by the lattice constants of the components of a binary system, assuming a linear relationship in accordance with Vegard's law. Slight variations from Vegard's law are known to occur. However, by measuring the lattice constant of the mixed crystal produced by this procedure, and applying this procedure iteratively, the desired lattice constant can be obtained. For most practical purposes, however, no iteration of the method is necessary. Taking, for example, the binary system $(SrTiO_3)_x \cdot (LaAlO_3)_{1-x}$, with the lattice constants of 0.3905 nm for $SrTiO_3$ and 0.3793 nm for $LaAlO_3$, these values are respectively entered on the vertical axes and connected with a line, while the horizontal x-axis shows the proportions of the two components.

Entering the diagram with a lattice constant, say 0.3855 nm for the superconductor $YBa_2Cu_3O_{7-\delta}$ (the means of its lattice constants along its a- and b-axis), one would find an x-value of aobut 0.55. Accordingly, a crystal drawn from about 55 mole percent of $SrTiO_3$ together with about 45 mole percent of $LaAlO_3$ would have a lattice constant in the immediate neighborhood of 0.3855 nm and, thus, would provide an excellent substrate for the deposition of a thin layer of $YBa_2Cu_3O_{7-\delta}$.

For a pseudo-ternary system, one would first determine the resultant lattice constant for the pseudo-binary system composed of two of the particular compounds and then combine the third compound with the resultant binary system. It will be clear to those skilled in the art how to calculate the appropriate percentages by weight, taking into account the possibly differing densities of the compounds.

It is also important to know the range of composition over which it is possible to make a solid solution mixture of the constituents. The stable allowable range can be found in phase diagrams of mixtures of the constituent materials (see e.g., E. M. Levin, *Phase Diagrams For Ceramists*, Vols. I–VI, R. Roth et al ed., (The American Ceramic Society, 1987), which is important for the synthesis of bulk materials. For the synthesis of an overlying buffer layer (which along with the underlying bulk material makes up the substrate), metastable mixtures, i.e., those outside the bounds given by the phase diagrams, may also be possible if sufficiently low processing temperatures are used in the thin film fabrication process.

It is not intended to limit the present invention to the specific embodiments described above. It is recognized that changes may be made in the materials and processes specifically descried herein without departing from the scope and teaching of the instant invention, and it is intended to encompass all other embodiments, alternatives, and modifications consistent with the invention.

We claim:

1. A method for manufacturing lattice-matched substrate for a high $T_c$ superconductor film wherein said film has a film lattice constant, said film has an orientation and a perovskite subcell and said substrate has an interfacial phase corresponding to said perovskite subcell, comprising:

choosing at least two materials from the group of known substrate materials, of which one has a first lattice constant smaller than said lattice constant of the selected superconductor material for the orientation selected, and of which another has a second lattice constant greater than said lattice film constant;

extensively milling said at least two materials to form powders;

mixing said powders intimately wherein the weight percentages of said powders are chosen such that said substrate has a substrate lattice constant substantially matched to said film lattice constant;

providing a single-crystal of the desired orientation from the chosen materials for the deposition of the superconductor film by drawing of the single crystal from the molten mixture of the powdered chosen materials and the cutting of the crystal to the desired size.

2. A method for manufacturing lattice-matched substrate for a high $T_c$ superconductor film wherein said film has a film lattice constant, said film has an orientation and a perovskite subcell and said substrate has an interfacial phase corresponding to said perovskite subcell, comprising:

choosing at least two materials from the group of known substrate materials, of which one has a first lattice constant smaller than said lattice constant of the selected superconductor material for the orientation selected, and of which another has a second lattice constant greater than said lattice film constant;

extensively milling said at least two materials to form powders;

mixing said powders intimately wherein the weight percentages of said powders are chosen such that said substrate has a substrate lattice constant substantially matched to said film lattice constant;

providing a single-crystal of the desired orientation from the chosen materials for the deposition of the superconductor film, and;

providing an epitaxial substrate of the desired orientation with a buffer layer comprising the chosen materials onto a body of bulk material.

3. The method in accordance with claim 2 CHARACTERIZED in that the deposition is made from a single source containing a pre-sintered mixture of the chosen materials.

4. The method in accordance with claim 2, CHARACTERIZED in that the thin film buffer layer deposition is made from separate sources each containing one or more of the chosen materials.

5. A method for manufacturing lattice-matched substrate for a high $T_c$ superconductor film wherein said film has a film lattice constant, said film has an orientation and a perovskite subcell and said substrate has an interfacial phase corresponding to said perovskite subcell, comprising:

choosing at least two materials from the group of known substrate materials, of which one has a first lattice constant smaller than said lattice constant of the selected superconductor material for the orientation selected, and of which another has a second lattice constant greater than said lattice film constant;

extensively milling said at least two materials to form powders;

mixing said powders intimately wherein the weight percentages of said powders are chosen such that said substrate has a substrate lattice constant substantially matched to said film lattice constant;

providing a single-crystal of the desired orientation from the chosen materials for the deposition of the superconductor film;

said substrate materials are chosen from the group comprising strontium titanate [$SrTiO^{3l}$; ] and lanthanium alumnate [$LaAlO_3$].

6. The method in accordance with claim 1 CHARACTERIZED in that the superconductor is $YBa_2Cu_3O_{7-\delta}$, where $0 \leq \delta \leq 1$.

* * * * *